(12) United States Patent
Chuang et al.

(10) Patent No.: US 9,425,168 B2
(45) Date of Patent: Aug. 23, 2016

(54) STUD BUMP AND PACKAGE STRUCTURE THEREOF AND METHOD OF MANUFACTURING THE SAME

(71) Applicant: WIRE TECHNOLOGY CO., LTD., Taichung (TW)

(72) Inventors: Tung-Han Chuang, Taipei (TW); Hsing-Hua Tsai, Taichung (TW); Jun-Der Lee, Taichung (TW)

(73) Assignee: Wire Technology Co., Ltd., Taichung (TW)

( * ) Notice: Subject to any disclaimer, the term of this patent is extended or adjusted under 35 U.S.C. 154(b) by 218 days.

(21) Appl. No.: 14/256,233

(22) Filed: Apr. 18, 2014

(65) Prior Publication Data

US 2015/0194409 A1 Jul. 9, 2015

(30) Foreign Application Priority Data

Jan. 3, 2014 (TW) .............................. 103100145 A (51) Int. Cl.
*H01L 23/00* (2006.01)
*H01L 25/065* (2006.01)
*H01L 25/00* (2006.01)

(52) U.S. Cl.
CPC ............ *H01L 25/0657* (2013.01); *H01L 24/11* (2013.01); *H01L 24/13* (2013.01); *H01L 24/81* (2013.01); *H01L 25/50* (2013.01); *H01L 24/05* (2013.01); *H01L 24/16* (2013.01); *H01L 24/83* (2013.01); *H01L 24/94* (2013.01); *H01L 2224/0401* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1134* (2013.01); *H01L 2224/131* (2013.01); *H01L 2224/1319* (2013.01); *H01L 2224/1329* (2013.01); *H01L 2224/13109* (2013.01); *H01L 2224/13111* (2013.01); *H01L 2224/13113* (2013.01); *H01L 2224/13139* (2013.01); *H01L 2224/16145* (2013.01); *H01L 2224/16146* (2013.01); *H01L 2224/16227* (2013.01); *H01L 2224/16503* (2013.01); *H01L 2224/73204* (2013.01); *H01L 2224/8109* (2013.01); *H01L 2224/8181* (2013.01); *H01L 2224/81203* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/8381* (2013.01); *H01L 2224/94* (2013.01); *H01L 2225/06513* (2013.01); *H01L 2225/06541* (2013.01); *H01L 2924/00015* (2013.01); *H01L 2924/01004* (2013.01); *H01L 2924/0132* (2013.01); *H01L 2924/0133* (2013.01); *H01L 2924/0134* (2013.01); *H01L 2924/0135* (2013.01); *H01L 2924/01046* (2013.01); *H01L 2924/01047* (2013.01); *H01L 2924/01057* (2013.01); *H01L 2924/01058* (2013.01); *H01L2924/01078* (2013.01); *H01L 2924/01079* (2013.01); *H01L 2924/12041* (2013.01); *H01L 2924/157* (2013.01); *H01L 2924/1579* (2013.01); *H01L 2924/15787* (2013.01); *H01L 2924/3651* (2013.01)

(58) Field of Classification Search
None
See application file for complete search history.

(56) References Cited

U.S. PATENT DOCUMENTS

2015/0194409 A1* 7/2015 Chuang ............... H01L 25/0657
257/737

*Primary Examiner* — Jack Chen (57) ABSTRACT

A stud bump structure, a package structure thereof and method of manufacturing the package structure are provided. The stud bump structure include a first chip; and a silver alloy stud bump disposed on the substrate, wherein the on-chip silver alloy stud bump includes Pd of 0.01~10 wt %, while the balance is Ag. The package structure further includes a substrate having an on-substrate bond pad electrically connected to the on-chip silver alloy stud bump by flip chip bonding.

11 Claims, 4 Drawing Sheets

STUD BUMP AND PACKAGE STRUCTURE THEREOF AND METHOD OF MANUFACTURING THE SAME

CROSS REFERENCE TO RELATED APPLICATIONS

This application claims priority of Taiwan Patent Application No. 103100145, filed on Jan. 3, 2014, the entirety of which is incorporated by reference herein.

BACKGROUND OF THE DISCLOSURE

1. Field of the Invention

The present invention relates to a stud bump structure, a package structure thereof and a method for manufacturing the package structure, and in particular, it relates to a silver alloy stud bump structure, a package structure thereof and a method for manufacturing the package structure.

2. Description of the Related Art

Advantages of flip chip assembly may include having many connection points, small distances between each connection point, small package areas, good performance at high frequencies, high reliability, and good resistance to electromagnetic interference. Therefore, flip chip assembly has been commonly used in packaging processes for an electronic device such as an integrated circuit (IC) or a light emitting diode (LED). Manufacturing and packaging a bump play an important role in the flip chip assembly process. Most of the flip chip bumps are made of solder alloys, such as Sn-37Pb, Sn-9Zn, Sn-0.7Cu, Sn-3.5Ag, Sn-51In, Sn-58Bi, Sn-3-Ag-0.5Cu, Sn-9Zn-3Bi, or the like. Methods for manufacturing a solder bump may include electroplating and stencil printing. However, a solder bump manufactured by electroplating is usually harmful to the environment and its specific alloy composition is usually difficult to control. In addition, it is also difficult to find an appropriate plating solution and plating process to form a Pb-free solder bump. For example, if a bump is formed of an alloy such as Sn-3.5Ag, Sn-0.7Cu, or Ag-0.5Cu, the composition of the alloy is usually hard to control. If a solder bump is to be formed of an alloy such as Sn-51In, Sn-58Bi, or Sn-9Zn—Bi, it is usually very difficult to find an appropriate plating solution.

Therefore, nowadays, stencil printing of solder paste has become an essential method in flip chip packaging processes. A key material for flip chip solder paste is solder powder. Generally, the particle size (diameter) of a solder powder in a surface mount technology (SMT) is between about 30 μm and 50 μm, wherein the solder powder of this size is easier to manufacture. However, since the size of a flip chip bump is usually smaller than 120 μm, the size of the solder powder is required to be smaller than 10 μm and the solder powder with this small size is very difficult to manufacture. In addition, when the size of the flip chip bump is decreased to be smaller than 100 μm, or even about 50 μm, each bump may only contain a few solder powders even if the size of the solder powder is smaller than 10 μm. Therefore, the difficulty of coplanarity tends to occur after a reflow process. Other problems in manufacturing a flip chip bump by solder paste include holes being formed by flux after a reflow process and manufacturing failures of the stencil printing may sharply increase when the distance between each connection point is less than 100 μm.

An electroplating gold bump or a gold stud bump manufactured by gold bond utilizing a gold wire can also be utilized as the flip chip bump for electrical connection. However, a problem of embrittlement at joint interface due to rapid formation of intermetallic compounds occurs when any of the electroplating gold bump and the gold stud bump is utilized as the flip chip bump. Further, if conventional soldering technologies are utilized for the assembly of substrate and any of the electroplating gold bump and the gold stud bump, a great quantity of gold from the electroplating gold bump or the gold stud bump will diffuse into the solder material, and a great quantity of brittle $AuSn_4$ intermetallic compounds is formed due to the extremely rapid diffusion from gold into solder. As a result, bonding utilizing an electrically conductive adhesive is commonly the only way to assemble a chip and a substrate through the electroplating gold bump or the gold stud bump. One of the drawbacks from the adhesive bonding is provision of electrical conductivity worse than that provided by solder bonding. Further, the two great advantages provided by solder bonding, self alignment and reworkability, are no longer gained when utilizing adhesive bonding. Moreover, the electroplating gold bump and the gold stud bump are both expensive when considering the manufacture and material costs.

As a result, in the electronic packaging industry, an electroplating copper bump or copper pillar, or a copper stud bump manufactured by copper bond utilizing a copper wire are considered as an alternative material utilized in the solder bonding process. However, problems of floating solder at joint interfaces due to slow formation of intermetallic compounds potentially occurs when any of the electroplating copper bump, electroplating copper pillar and the copper stud bump is utilized as the flip chip bump. Moreover, copper tends to be oxidized and corroded, and therefore the reliability of the resulting package products is poor. More seriously, copper is too hard for the packaging technology, and under-pad chip cratering tends to occur during manufacture of the copper bumps, and a coplanarity problem also tends to occur during the assembly of the copper bumps and substrate. The coplanarity problem is further harmful in the ultrafine pitch packages and 3D-IC packages.

BRIEF SUMMARY OF THE DISCLOSURE

An embodiment of the disclosure provides a stud bump structure, including a first chip and a silver alloy stud bump. The silver alloy stud bump is disposed overlying the first chip. A composition of the silver alloy stud bump is selected from one of a group consisting of: a first composition of 0.01 to 10 weight percent of palladium and a balance of silver; a second composition of 0.01 to 10 weight percent of palladium, 0.01 to 10 weight percent of platinum and a balance of silver; a third composition of 0.01 to 10 weight percent of palladium, 0.01 to 10 weight percent of platinum, 0.01 to 10 weight percent of gold and a balance of silver; a fourth composition of 0.01 to 10 weight percent of palladium, 10 to 800 ppm of a trace metal and a balance of silver, wherein the trace metal comprises at least one of 10 to 600 ppm of beryllium, 10 to 100 ppm of cerium and 10 to 100 ppm of lanthanum; a fifth composition of 0.01 to 10 weight percent of palladium, 0.01 to 10 weight percent of platinum, 10 to 800 ppm of a trace metal and a balance of silver, wherein the trace metal comprises at least one of 10 to 600 ppm of beryllium, 10 to 100 ppm of cerium and 10 to 100 ppm of lanthanum; a sixth composition of 0.01 to 10 weight percent of palladium, 0.01 to 10 weight percent of gold, 10 to 800 ppm of a trace metal and a balance of silver, wherein the trace metal comprises at least one of 10 to 600 ppm of beryllium, 10 to 100 ppm of cerium and 10 to 100 ppm of lanthanum; and a seventh composition of 0.01 to 10 weight percent of palladium, 0.01 to 10 weight percent of platinum, 0.01 to 10 weight percent of gold, 10 to 800 ppm of a trace metal and a balance of silver, wherein the trace metal comprises at least one of 10 to 600 ppm of beryllium, 10 to 100 ppm of cerium and 10 to 100 ppm of lanthanum.

Another embodiment of the disclosure provides a package structure comprising a first chip, an on-chip silver alloy stud bump and a substrate. The first chip comprises an on-chip bonding pad. The on-chip silver alloy stud bump is disposed overlying the on-chip bonding pad of the first chip. The substrate comprises an on-substrate bonding pad electrically connected to the on-chip silver alloy stud bump by flip-chip bonding to the first chip. A composition of the on-chip silver alloy stud bump is selected from one of a group consisting of a first composition of 0.01 to 10 weight percent of palladium and a balance of silver; a second composition of 0.01 to 10 weight percent of palladium, 0.01 to 10 weight percent of platinum and a balance of silver; a third composition of 0.01 to 10 weight percent of palladium, 0.01 to 10 weight percent of platinum, 0.01 to 10 weight percent of gold and a balance of silver; a fourth composition of 0.01 to 10 weight percent of palladium, 10 to 800 ppm of a trace metal and a balance of silver, wherein the trace metal comprises at least one of 10 to 600 ppm of beryllium, 10 to 100 ppm of cerium and 10 to 100 ppm of lanthanum; a fifth composition of 0.01 to 10 weight percent of palladium, 0.01 to 10 weight percent of platinum, 10 to 800 ppm of a trace metal and a balance of silver, wherein the trace metal comprises at least one of 10 to 600 ppm of beryllium, 10 to 100 ppm of cerium and 10 to 100 ppm of lanthanum; a sixth composition of 0.01 to 10 weight percent of palladium, 0.01 to 10 weight percent of gold, 10 to 800 ppm of a trace metal and a balance of silver, wherein the trace metal comprises at least one of 10 to 600 ppm of beryllium, 10 to 100 ppm of cerium and 10 to 100 ppm of lanthanum; and a seventh composition of 0.01 to 10 weight percent of palladium, 0.01 to 10 weight percent of platinum, 0.01 to 10 weight percent of gold, 10 to 800 ppm of a trace metal and a balance of silver, wherein the trace metal comprises at least one of 10 to 600 ppm of beryllium, 10 to 100 ppm of cerium and 10 to 100 ppm of lanthanum.

Still another embodiment of the disclosure provides a method for manufacturing a package structure. First, a silver alloy wire is provided. Then, an end of the silver alloy wire is melted to form a free air ball. Next, the free air ball is bonded onto an on-chip bonding pad of a first chip to form a ball bond. Furthermore, the silver alloy wire is cut off, such that the ball bond is left on the on-chip bonding pad to form an on-chip silver alloy stud bump. Finally, the first chip is electrically connected to an on-substrate bonding pad of a substrate through the on-chip silver alloy stud bump utilizing flip-chip bonding. Moreover, a composition of the on-chip silver alloy stud bump is selected from one of a group consisting of a first composition of 0.01 to 10 weight percent of palladium and a balance of silver; a second composition of 0.01 to 10 weight percent of palladium, 0.01 to 10 weight percent of platinum and a balance of silver; a third composition of 0.01 to 10 weight percent of palladium, 0.01 to 10 weight percent of platinum, 0.01 to 10 weight percent of gold and a balance of silver; a fourth composition of 0.01 to 10 weight percent of palladium, 10 to 800 ppm of a trace metal and a balance of silver, wherein the trace metal comprises at least one of 10 to 600 ppm of beryllium, 10 to 100 ppm of cerium and 10 to 100 ppm of lanthanum; a fifth composition of 0.01 to 10 weight percent of palladium, 0.01 to 10 weight percent of platinum, 10 to 800 ppm of a trace metal and a balance of silver, wherein the trace metal comprises at least one of 10 to 600 ppm of beryllium, 10 to 100 ppm of cerium and 10 to 100 ppm of lanthanum; a sixth composition of 0.01 to 10 weight percent of palladium, 0.01 to 10 weight percent of gold, 10 to 800 ppm of a trace metal and a balance of silver, wherein the trace metal comprises at least one of 10 to 600 ppm of beryllium, 10 to 100 ppm of cerium and 10 to 100 ppm of lanthanum; and a seventh composition of 0.01 to 10 weight percent of palladium, 0.01 to 10 weight percent of platinum, 0.01 to 10 weight percent of gold, 10 to 800 ppm of a trace metal and a balance of silver, wherein the trace metal comprises at least one of 10 to 600 ppm of beryllium, 10 to 100 ppm of cerium and 10 to 100 ppm of lanthanum.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE DISCLOSURE

The following description is of the best-contemplated mode of carrying out the invention. This description is made for the purpose of illustrating the general principles of the invention and should not be taken in a limiting sense. The scope of the invention is best determined by reference to the appended claims.

Moreover, the formation of a first feature over and on a second feature in the description that follows may include embodiments in which the first and second features are formed in direct contact, and may also include embodiments in which additional features may be formed between the first and second features, such that the first and second features may not be in direct contact.

In the subsequent description including the claimed inventions, the phrase ppm is an abbreviation of "parts per million" and means a weight fraction of an element in a composition of a feature. Moreover, the phrase "integrated circuit" and the abbreviation thereof, IC, can be selected from any one or a combination of two or more of logic circuit and the periphery circuit thereof, volatile memory circuit and the periphery circuit thereof, nonvolatile memory circuit and the periphery circuit thereof, light emitting elements and the relating circuit thereof with the periphery circuit thereof, photo sensing elements and the relating circuit thereof with the periphery circuit thereof, devices of micro-electromechanical systems (MEMS) and the relating circuit thereof with the periphery circuit thereof, circuit for test, and the like.

Figure 1:
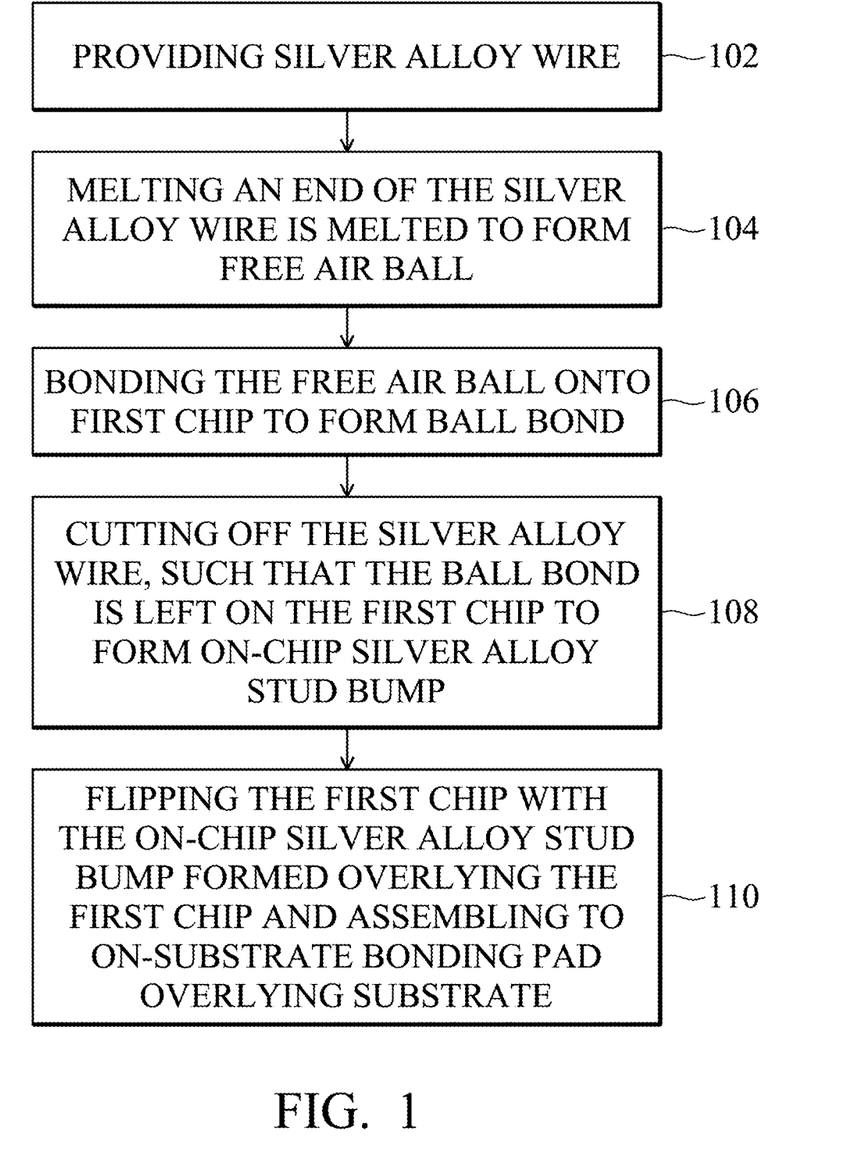
FIG. 1 is a flow chart of a manufacturing process for a stud bump structure and a package structure thereof according to one embodiment.

FIG. 1 illustrates a flow chart of manufacturing a stud bump structure and a package structure thereof according to one embodiment. In step 102, a silver alloy wire is provided. In step 104, an end of the silver alloy wire is melted to form a free air ball. In step 106, the free air ball is bonded onto a first chip to form a ball bond. In step 108, the silver alloy wire is cut off, such that the ball bond is left on the first chip to form an on-chip silver alloy stud bump. In step 110, the first chip with the on-chip silver alloy stud bump formed overlying the first chip is flipped and assembled to an on-substrate bonding pad overlying a substrate.

FIGS. 2 to 5 schematically illustrate side views of steps or stages of a manufacturing method of a stud bump structure according to one embodiment.

Figure 2:
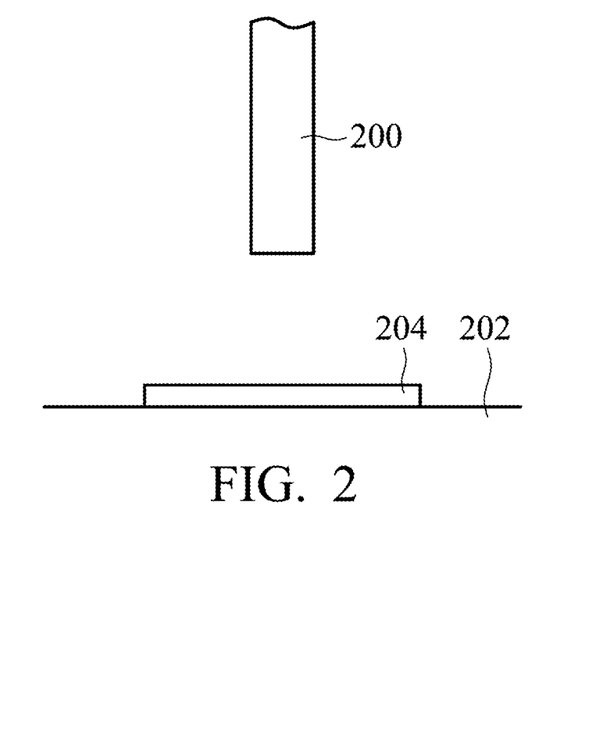
FIG. 2 schematically illustrates a side view of a step or stage of a manufacturing method of a stud bump structure according to one embodiment.

Referring to FIGS. 1 and 2, a silver alloy wire 200 is provided in step 102. In addition, a first chip 202 comprising an on-chip bonding pad 204 may also be provided. The silver alloy wire 200 is pulled above the bonding pad 204 overlying the first chip 202. According to this embodiment, a composition of the silver alloy wire 200 is silver with 0.01 to 10 weight percent of palladium added thereto. Alternatively, 0.01 to 10 weight percent of gold and/or platinum can further added to silver with described 0.01 to 10 weight percent of palladium. Optionally, 10 to 800 ppm of one or any mixture of beryllium, cerium and lanthanum can be added to the described compositions. A wire diameter of the silver alloy wire 200 may be between 10 μm and 50 μm, but the silver alloy wire 200 having other various proper diameters may also be used in various applications. The first chip 202 may be a divided single semiconductor chip (i.e. a silicon chip) after completion of an integrated circuit manufacturing process, or one of a plurality of undivided chips in a semiconductor wafer (i.e. a silicon wafer) after completion of an integrated circuit manufacturing process. Examples for the on-chip bonding pad 204 may include, but are not limited to, a copper pad, an aluminum pad, a gold pad, a silver pad, a nickel pad, or other appropriate surface-finished pads.

In more detail, the composition of the silver alloy wire 200 is selected from one of a group consisting of a first composition of 0.01 to 10 weight percent of palladium and a balance of silver; a second composition of 0.01 to 10 weight percent of palladium, 0.01 to 10 weight percent of platinum and a balance of silver; a third composition of 0.01 to 10 weight percent of palladium, 0.01 to 10 weight percent of platinum, 0.01 to 10 weight percent of gold and a balance of silver; a fourth composition of 0.01 to 10 weight percent of palladium, 10 to 800 ppm of a trace metal and a balance of silver, wherein the trace metal comprises at least one of 10 to 600 ppm of beryllium, 10 to 100 ppm of cerium and 10 to 100 ppm of lanthanum; a fifth composition of 0.01 to 10 weight percent of palladium, 0.01 to 10 weight percent of platinum, 10 to 800 ppm of a trace metal and a balance of silver, wherein the trace metal comprises at least one of 10 to 600 ppm of beryllium, 10 to 100 ppm of cerium and 10 to 100 ppm of lanthanum; a sixth composition of 0.01 to 10 weight percent of palladium, 0.01 to 10 weight percent of gold, 10 to 800 ppm of a trace metal and a balance of silver, wherein the trace metal comprises at least one of 10 to 600 ppm of beryllium, 10 to 100 ppm of cerium and 10 to 100 ppm of lanthanum; and a seventh composition of 0.01 to 10 weight percent of palladium, 0.01 to 10 weight percent of platinum, 0.01 to 10 weight percent of gold, 10 to 800 ppm of a trace metal and a balance of silver, wherein the trace metal comprises at least one of 10 to 600 ppm of beryllium, 10 to 100 ppm of cerium and 10 to 100 ppm of lanthanum.

Figure 3:
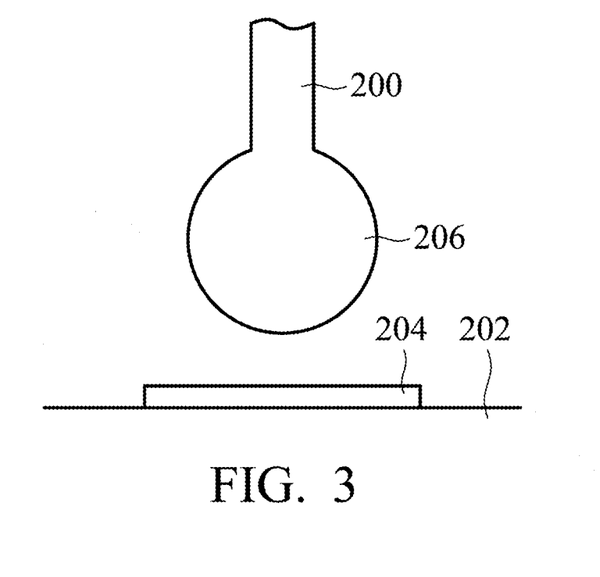
FIG. 3 schematically illustrates a side view of a step or stage of a manufacturing method of a stud bump structure according to one embodiment.

Referring to FIGS. 1 and 3, an end of the silver alloy wire 200 is melted to form a free air ball 206 in step 104. According to the embodiment, the free air ball 206 may be formed by an electric flame off (EFO). However, according to some embodiments, the free air ball 206 may be formed by other methods during a wire bonding process.

Figure 4:
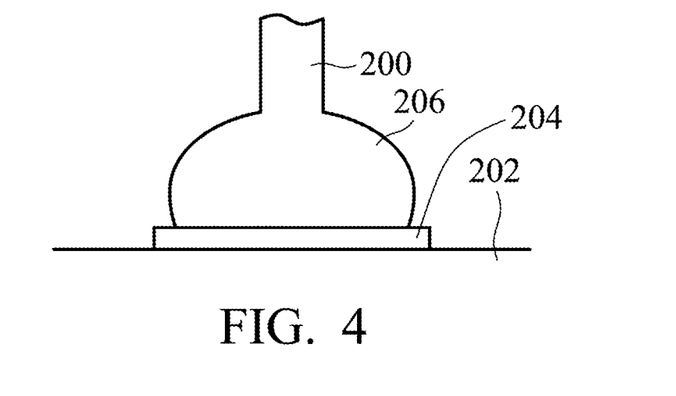
FIG. 4 schematically illustrates a side view of a step or stage of a manufacturing method of a stud bump structure according to one embodiment.

Referring to FIGS. 1 and 4, the free air ball 206 is bonded onto the first chip 202 to form a ball bond 208 in step 106. According to the embodiment, the free air ball 206 is bonded onto the on-chip bonding pad 204 overlying the first chip 202 by hot pressing or ultrasonic hot pressing. However, according to some embodiments, the free air ball 206 may be bonded to the first chip 202 to form the first ball bond 208 by other methods during a wire bonding process.

Figure 5:
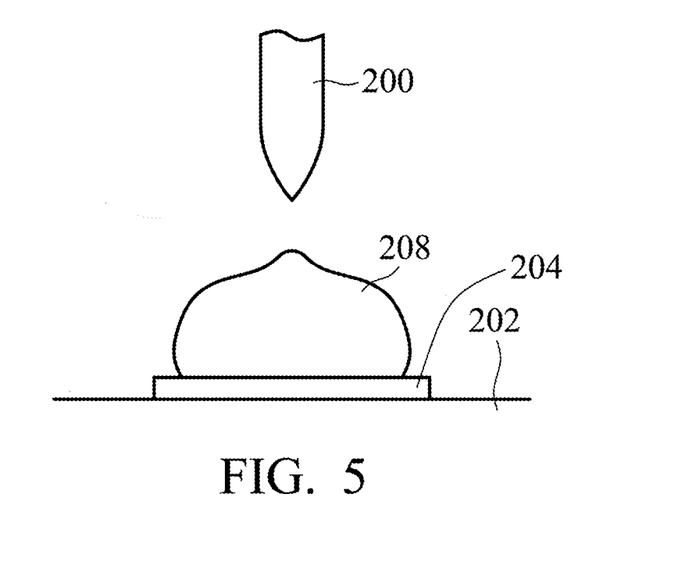
FIG. 5 schematically illustrates a side view of a step or stage of a manufacturing method of a stud bump structure according to one embodiment.

Referring to FIGS. 1 and 5, the silver alloy wire 200 is cut off, such that the first ball bond 208 is left on the on-chip bonding pad 204 of the first chip 202 to form an on-chip silver alloy stud bump 208 in step 108. According to the embodiment, the stud bump structure may comprise: the first chip 202, and the on-chip silver alloy stud bump 208 disposed overlying the on-chip bonding pad 204 on the first chip 202. A diameter of the on-chip silver alloy stud bump 208 may be between 20 μm and 100 μm, but the on-chip silver alloy stud bump 208 having other various proper diameters may also be used in various applications when a silver alloy wire 200 with a diameter thicker than 50 μm is employed.

Figure 6:
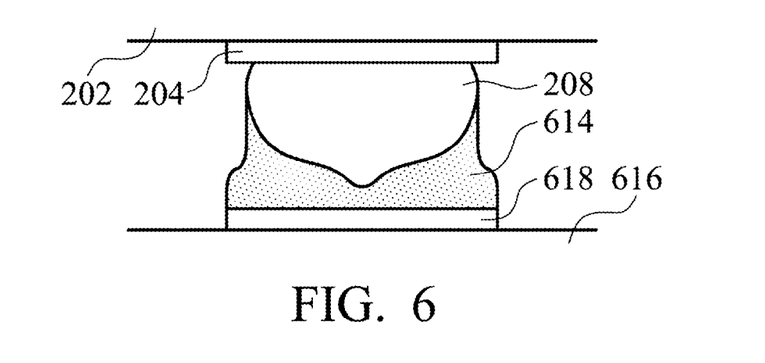
FIG. 6 schematically illustrates a side view of a step or stage of a manufacturing method of a package structure utilizing an adhesive according to one embodiment.

Referring to FIGS. 1 and 6, the first chip 202 is flipped and the on-chip silver alloy stud bump 208 overlying the on-chip bonding pad 204 is disposed on an on-substrate bonding pad 618 overlying a substrate 616. Then, the on-chip silver alloy stud bump 208 is bonded onto the on-substrate bonding pad 618 by an adhesive 614 to form a first flip chip package. In this embodiment, a composition of the on-chip silver alloy stud bump 208 is silver with 0.01 to 10 weight percent of palladium added thereto. Alternatively, 0.01 to 10 weight percent of gold and/or platinum can further added to silver with described 0.01 to 10 weight percent of palladium. Optionally, 10 to 800 ppm of one or any mixture of beryllium, cerium and lanthanum can be added to the described compositions. The substrate 616 may be, for example, a ceramic interposer with through vias therein, a printed circuit board, or a second chip different from the first chip 202, such as a chip with a crystalline silicon substrate comprising a silicon interposer with through silicon vias (TSVs) therein. Examples for the on-chip bonding pad 204 and the on-substrate bonding pad 618 may independently include, but are not limited to a copper pad, an aluminum pad, a gold pad, a silver pad, a nickel pad, or other appropriate surface-finished pads. The adhesive 614 may be an isotropic electrically conductive adhesive or an anisotropic electrically conductive adhesive, for example. In other embodiments, an electrically non-conductive adhesive can be alternatively utilized. The electrically non-conductive adhesive fills the space among a plurality of on-chip silver alloy stud bumps 208. The volume of the electrically non-conductive adhesive shrinks during cooling, resulting in the on-chip silver alloy stud bump 208 being in direct and intimate contact with, and electrically connected to, the on-substrate bonding pad 618 to conduct electrical current therebetween. After cooling, the electrically non-conductive adhesive still continues to support the on-chip silver alloy stud bump 208 and the on-substrate bonding pad 618 and keeps them in direct and intimate contact with each other.

In more detail, the composition of the on-chip silver alloy stud bump 208 shown in FIG. 6 may be the same as that of the silver alloy wire 200. That is, the composition of the on-chip silver alloy stud bump 208 may selected from one of the first to seventh composition of the composition options listed for the silver alloy wire 200 as described above.

Figure 7:
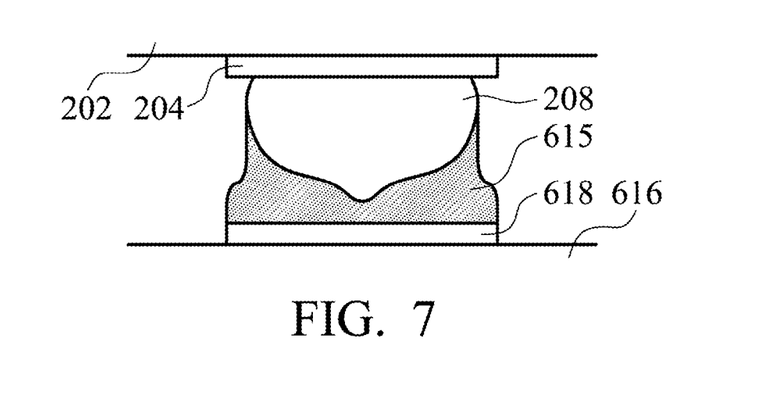
FIG. 7 schematically illustrates a side view of a step or stage of a manufacturing method of a package structure utilizing a solder material according to one embodiment.

Referring to FIGS. 1 and 7, the first chip 202 is flipped and the on-chip silver alloy stud bump 208 overlying the on-chip bonding pad 204 is disposed on an on-substrate bonding pad 618 overlying a substrate 616. Then, the on-chip silver alloy stud bump 208 is alternatively bonded onto the on-substrate bonding pad 618 by a solder material 615 to form a second flip chip package. In this embodiment, a composition of the on-chip silver alloy stud bump 208 is silver with 0.01 to 10 weight percent of palladium added thereto. Alternatively, 0.01 to 10 weight percent of gold and/or platinum can further added to silver with described 0.01 to 10 weight percent of palladium. Optionally, 10 to 800 ppm of one or any mixture of beryllium, cerium and lanthanum can be added to the described compositions. The substrate 616 may be, for example, a ceramic interposer with completion of formation of through vias therein, a printed circuit board, or a second chip different from the first chip 202, such as a chip with crystalline silicon substrate comprising a silicon interposer with completion of formation of through silicon vias (TSVs) therein. Examples for the on-chip bonding pad 204 and the on-substrate bonding pad 618 may independently include, but are not limited to a copper pad, an aluminum pad, a gold pad, a silver pad, a nickel pad, or other appropriate surface finished pads. The solder material 615 may be pure tin, pure indium or an alloy such as Sn-37Pb, Sn-9Zn, Sn-0.7Cu, Sn-3.5Ag, Sn-51In, Sn-58Bi, Sn-3-Ag-0.5Cu, Sn-9Zn-3Bi, or the like. In this embodiment, the solder material 615 is a filler metal with a thickness of 10 μm or greater, and parts of the solder filler metal react with the on-substrate bonding pad 618 during the bonding of the on-chip silver alloy stud bump 208 and the on-substrate bonding pad 618, while leaving the remaining parts of the solder filler metal, shown as the solder material 615 in FIG. 7, at an interface between the on-chip silver alloy stud bump 208 and the on-substrate bonding pad 618. In an alternative embodiment, the solder material 615 is a thin film with a thickness less than 10 μm, and the resulting structure is similar to that shown in FIG. 8. The difference is that the solder film at the interface between the on-chip silver alloy stud bump 208 and the on-substrate bonding pad 618 overlying the substrate 616 reacts with the on-substrate bonding pad 618 during heating and is completely exhausted during bonding the on-chip silver alloy stud bump 208 and the on-substrate bonding pad 618, while forming a tin containing intermetallics layer at an interface between the on-chip silver alloy stud bump 208 and the on-substrate bonding pad 618. In one embodiment, the bonding step utilizing the solder film is performed under vacuum environment between $10^{-3}$ Torr and $10^{-6}$ Torr utilizing hot pressing bonding at a temperature higher than a melting point of the solder film with a difference over 10° C. with a pressure between 0.1 Kg/mm$^2$ and 1 Kg/mm$^2$ applied to the on-chip silver alloy stud bump 208 and the on-substrate bonding pad 618 for five to thirty minutes. The intermetallic compounds may have various compositions such as $Ag_3Sn$, $Cu_6Sn_5$, $Cu_3Sn$, $Ni_3Sn_4$ or the like, depending on the various types and/or the compositions of the on-substrate bonding pad 618. These intermetallic compounds all have melting points higher than those of solder materials, and provide an advantage in that the relating structures can be assembled at lower temperatures corresponding to the melting points of common solder materials, but the resulting joint can withstand temperatures higher than the melting points of common solder materials.

In more detailed, the composition of the on-chip silver alloy stud bump 208 shown in FIG. 7 may be the same as that of the silver alloy wire 200. That is, the composition of the on-chip silver alloy stud bump 208 may selected from one of the first to seventh composition of the composition options listed for the silver alloy wire 200 as described above.

Figure 8:
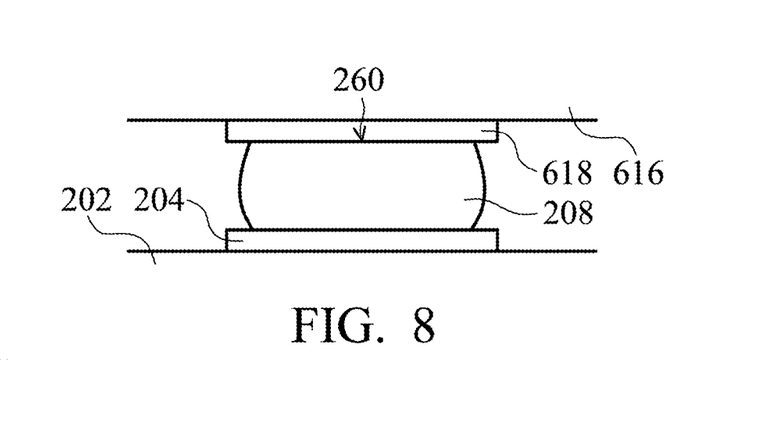
FIG. 8 schematically illustrates a side view of a step or stage of a manufacturing method of a package structure utilizing hot pressing bonding according to one embodiment.

Referring to FIGS. 1 and 8, the first chip 202 is flipped and the on-chip silver alloy stud bump 208 overlying the on-chip bonding pad 204 is disposed on an on-substrate bonding pad 618 overlying a substrate 616. Then, the on-chip silver alloy stud bump 208 is alternatively bonded onto the on-substrate bonding pad 618 by application of heat and pressure directly to the first chip 202, the on-chip silver alloy stud bump 208 and the on-substrate bonding pad 618 of the substrate 618 utilizing hot pressing bonding to form a second flip chip package. In one embodiment, the hot pressing bonding is performed under an atmospheric environment at a temperature between 300° C. and 600° C. with a pressure between 0.5 Kg/mm$^2$ and 3 Kg/mm$^2$ applied to the on-chip silver alloy stud bump 208 and the on-substrate bonding pad 618 for three to sixty seconds. In this embodiment, a composition of the on-chip silver alloy stud bump 208 is silver with 0.01 to 10 weight percent of palladium added thereto. Alternatively, 0.01 to 10 weight percent of gold and/or platinum can further added to silver with described 0.01 to 10 weight percent of palladium. Optionally, 10 to 800 ppm of one or any mixture of beryllium, cerium and lanthanum can be added to the described compositions. The substrate 616 may be, for example, a ceramic interposer with completion of formation of through vias therein, a printed circuit board, or a second chip different from the first chip 202, such as a chip with crystalline silicon substrate comprising a silicon interposer with completion of formation of through silicon vias (TSVs) therein. Examples for the on-chip bonding pad 204 and the on-substrate bonding pad 618 may independently include, but are not limited to a copper pad, an aluminum pad, a gold pad, a silver pad, a nickel pad, or other appropriate surface finished pads.

In more detailed, the composition of the on-chip silver alloy stud bump 208 shown in FIG. 8 may be the same as that of the silver alloy wire 200. That is, the composition of the on-chip silver alloy stud bump 208 may selected from one of the first to seventh composition of the composition options listed for the silver alloy wire 200 as described above.

In one embodiment, the composition of the on-chip silver alloy stud bump 208 shown in FIG. 5 is silver with 0.01 to 10 weight percent of palladium added thereto. Alternatively, 0.01 to 10 weight percent of gold and/or platinum can further added to silver with described 0.01 to 10 weight percent of palladium. Optionally, 10 to 800 ppm of one or any mixture of beryllium, cerium and lanthanum can be added to the described compositions. In more detailed, the composition of the on-chip silver alloy stud bump 208 shown in FIG. 5 may be the same as that of the silver alloy wire 200. That is, the composition of the on-chip silver alloy stud bump 208 may selected from one of the first to seventh composition of the composition options listed for the silver alloy wire 200 as described above. It was discovered that if a stud bump is formed of pure silver (Ag), the silver stud bump will suffer problems such as electromigration, being too soft, and easy oxidization and corrosion due to humidity. However, if an appropriate amount of palladium (Pd) is added into the silver alloy stud bump, it can not only improve the strength, humidity corrosion resistance, and oxidation resistance of the silver alloy stud bump, but also suppress the electromigration of silver. In addition, excessive formation of intermetallic compounds is also suppressed due to the low diffusion rate of palladium. On the other hand, when too much palladium is added into the silver alloy stud bump and the palladium content exceeds the described range, the silver alloy stud bump potentially becomes too rigid and too brittle, limiting its applications. Furthermore, an appropriate amount of gold (Au), platinum (Pt) or both of them can be added into the silver alloy stud bump to further improve the strength, humidity corrosion resistance and oxidation resistance of the silver alloy stud bump. Moreover, a trace metal comprising beryllium, cerium, lanthanum or any combination thereof can optionally be added into the silver alloy stud bump to decrease the grain size of the silver alloy stud bump and increase the strength, ductility and resistance to high-temperature creep of the silver alloy stud bump. On the other hand, if too much gold or platinum is added into the silver alloy stud bump and the content exceeds the described range, the interface between the silver alloy stud bump stud bump and the on-chip bonding pad (i.e. aluminum pad) may contain intermetallic compounds that are too thick, resulting in embrittlement of the connection point, an increase of electrical resistivity and an increase of process costs. In addition, when too much trace metal comprising beryllium, cerium, lanthanum or any combination thereof is added into the silver alloy stud bump and the content exceeds the described range, the electrical resistivity of the silver alloy stud bump is also increased, and the connection point also becomes brittle, and furthermore, the resistance to oxidation and corrosion of the silver alloy stud bump potentially become worse.

It should be noted that, although the stud bump structure described above comprises specific main compositions of silver and palladium, and specific optional compositions of gold, platinum, beryllium, cerium and lanthanum, the scope of the disclosure is not to be limited. According to some embodiments, the stud bump structure may also comprise other metal elements, non-metal elements, or some contaminants. However, these additional elements should be used depending on various applications, and the performance of the stud bump structure should remain the same.

Compared to stud bumps formed of other metals (such as a gold stud bump, a copper stud bump or a copper pillar), the silver alloy stud bump according to various embodiments can be more widely applied to various applications and have a better stability. For example, if a gold (Au) stud bump is used, a great amount of gold in the gold stud bump may be dissolved into melting solder to form an intermetallic compound, $AuSn_4$, when the stud bumping chip is assembled to a substrate by soldering process. Furthermore, when the device is operated or when the reliability test is performed, a great amount of brittle intermetallic compounds, $Au_xAl_y$, and Kirkendall voids may be formed at the interface between the gold stud bump and the aluminum pad, resulting in a breakage of the connection points, an increase of electrical resistivity, and a decrease of the reliability of the electronic products. Therefore, generally, the gold stud bump is assembled by a polymer conductive adhesive. However, the electrical and thermal conductivities of polymer conductive adhesive is much worse than metallic solder bonding, and the polymer conductive adhesive also lacks the advantages of self alignment and reworkability provided by solder bonding.

Conversely, if a copper stud bump is used for flip chip bonding, there may be insufficient intermetallic compounds formed at the interface between the copper stud bump and the aluminum pad, resulting in the problem of floating solder, and therefore it will be difficult to know whether or not it is connected successfully. In addition, the resulting products tend to fail when a metal residue test is conducted. Furthermore, copper is prone to oxidize and corrode, and the reliability of resulting electronic devices is usually poor. Moreover, since rigidity and hardness of copper are high, the under-pad chip may be broken during the copper stud bumping process. Therefore, it is difficult to use a copper stud bump in the process described above. Recently, packages of three-dimensional (3-D) IC and 2.5-D IC utilize copper pillars as flip chip conductive bumps. However, the copper pillars are hard and rigid, and therefore it is difficult to plastically deform for the solid contact between the copper pillars and bonding pads during the assembly process utilizing hot pressing bonding, resulting in a lot of voids remaining therebetween, or even failure to bond. As a result, a problem of coplanar failure can occur in the matrix of copper pillars in the package. The problem is getting worse according to the trend of decreasing the size of the package contacts.

Conversely, the silver alloy stud bumps according to various embodiments are softer, and therefore, easier to plastically deform for the solid contact between the silver alloy stud bumps and bonding pads during the assembly process utilizing hot pressing bonding, resulting in decrease or even elimination of the problem of coplanar failure in the copper pillars. Therefore, the silver alloy stud bumps according to various embodiments are especially suitable for utilization for the chip assembly of package products of 3D-IC and/or 2.5D-IC. Further, the silver alloy stud bumps according to various embodiments are softer, and therefore, a chip may not be damaged when bonding the free air ball thereon. There may not be so much brittle intermetallic compounds as the gold stud bump formed during the bonding process. In contrast to the copper stud bump, there may still be enough amount of the intermetallic compounds formed, leading to a satisfactory bonding. In addition, the resulting products can pass the metal residue test. According to various embodiments, the silver alloy stud bump may be bonded by soldering, conductive adhesive, or hot pressing, but other bonding methods may also be used depending on applications. Compared thereto, it is known that the conventional electroplating gold bumps or gold stud bumps cannot be utilized in the assembly process using solder bonding due to high dissolvability of gold in melted solder, and the hot pressing method cannot be utilized in the assembly process using copper stud bumps or copper pillars due to the coplanarity issue.

In addition, the described silver alloy stud bump may be formed overlying a chip or may be directly formed overlying an undivided wafer to perform a special wafer level package technology. An advantage of forming the silver alloy stud bumps on a wafer directly includes the processing cost being reduced by forming a great amount of the silver alloy stud bumps before cutting the wafer. In a wafer level packaging process, more than ten thousand stud bumps may be formed on a single wafer before dicing. In other words, the wafer is continuously heated during the hot pressing process to form the stud bumps. Therefore, when the last stud bump is finally formed on the wafer, the first stud bump formed at the beginning of the process may be heated with the wafer for a long time, such as dozens of minutes. As a result, with the early bonded gold stud bumps, there is the concern that a great amount of intermetallic compounds may grow after completion of the wafer level packaging process. In this case, the gold stud bump formed at the initial stage of the process may be damaged due to the embrittlement of the connection point and the bonding strength (ie. adhesive force) of the connection points being weakened. Therefore, the gold stud bump has encountered severe problems for the application in wafer level packaging. When the electroplating gold bumps or gold stud bumps are utilized, they are usually only able to be formed on chips divided from wafers, and cannot be formed overlying the wafer directly prior to dividing the wafer into chips. In contrast, copper stud bumps may result in insufficient intermetallic compounds at the bump/pad interface and are not suitable for a wafer level package, either. In addition, copper is so rigid that the wafer may be damaged during the bonding process. More severely, copper tends to be oxidized at high temperatures, especially for those stud bumps formed at the beginning of the process and have been heated with the wafer for a long time during the wafer level packaging. When copper pillars are utilized in the wafer level package technology for 3D-IC or 2.5D-IC, some of the copper pillars will not be in contact with the bonding pads during the hot pressing step due to various heights, the so-called coplanarity problem, resulting in formation of voids at the bonding interface, or even failure to bond.

On the other hand, for the silver alloy stud bumps, the intermetallic compounds may be grown slowly to an appropriate thickness and the connection can be confirmed by the appearance of the intermetallic compound. In addition, when the silver alloy stud bumps are formed directly on a wafer during wafer level packaging, even if the silver alloy stud bumps formed at the initial stage of the process have been heated with the wafer for a long time, there will not be a great amount of intermetallic compounds formed resulting from heating. Therefore, the bonding strength of the silver alloy stud bumps can be maintained. It is obvious that the silver alloy stud bump in this invention is superior to the gold stud bump and copper stud bump for application in wafer level packages.

According to the various embodiments described above, a novel silver alloy stud bump, a package thereof and a method for manufacturing the same are provided. The silver alloy stud bump may form a sufficient amount of intermetallic compounds with an aluminum pad, such that a satisfactory bonding interface may result. The problem of floating solder that can occur with the utilization of copper stud bumps or copper pillars can be avoided. On the other hand, since the intermetallic compound of the silver alloy stud bump grows very slowly, the interface of the connection points will not become brittle, and the reliability of the silver alloy stud bump and the resulting product may be improved. In addition, the silver alloy stud bump is softer, and therefore is able to plastically deform during hot pressing to be in solid contact with the on-substrate bonding pad, completing a perfect bonding without the coplanarity problem that can occur with the utilization of copper pillars. Compared to electroplating solder bumps, the silver alloy stud bump is better for the environment (resulting in less pollution) and the composition of the silver alloy may be controlled more precisely. Moreover, the difficulty of coplanarity due to the stencil printing of solder paste may be avoided. Further, the silver alloy stud bump may be used in a wafer level packaging process.

Subsequently, more detailed examples and comparative examples are described and are not intended to limit the scope of the application.

Comparative Example 1

One end of a pure gold wire (diameter: 17.4 μm) was melted by arc discharge to form a free air ball due to surface tension. The free air ball was bonded to an aluminum pad on a silicon chip to form a ball bond by ultrasonic hot pressing of a wire bonding technology. Then, the gold wire was cut off to form a gold stud bump. The manufacturing details are shown in Table 1. The size of the resulting gold stud bumps are shown in Table 2. The adhesion force of the resulting gold stud bumps are shown in Table 3.

Comparative Example 2

One end of a pure copper wire (diameter: 17.4 μm) was melted by arc discharge to form a free air ball due to surface tension. The free air ball was bonded to an aluminum pad on a silicon chip to form a ball bond by ultrasonic hot pressing of a wire bonding technology. Then, the copper wire was cut off to form a copper stud bump.

Example 1

Manufacturing Stud Bump

One end of a silver alloy wire (96 wt % Ag-4 wt % Pd-600 ppm Be-100 pm Ce-100 ppm La; diameter: 17.4 μm) was melted by arc discharge to form a free air ball due to surface tension. The free air ball was bonded to an aluminum pad on a silicon chip to form a ball bond by ultrasonic hot pressing of a wire bonding technology. Then, the silver alloy wire was cut off to form a silver alloy stud bump. The manufacturing details are shown in Table 1. The size of the resulting silver alloy stud bumps are shown in Table 2. The adhesion force of the resulting silver alloy stud bumps are shown in Table 3. Referring to Table 2, the size of the silver alloy stud bump was smaller than the size of the gold stud bump although the wires used for forming the stud bumps had the same diameter. The smaller size of the silver alloy stud bump had an advantage as it may be used in a high density package with a small connection distance. Further, a ball shear test (as shown in Table 3) was performed to the resulting silver alloy stud bump in Example 1 and the gold stud bump in Comparative Example 1 by a bond tester DAGE4000, and the result showed that the adhesion force of the silver alloy stud bump was 1528% higher than the adhesion force of the gold stud bump.

TABLE 1

The manufacturing details

| | Silver alloy stud bump | Gold stud bump |
| --- | --- | --- |
| Power | 230 (dac) | 230 (dac) |
| Time | 10 (ms) | 13.5 (ms) |
| Adhesion force | 24 (gf) | 24 (gf) |
| Adhesion time | 12 (ms) | 12 (ms) |
| Current | 46 (mA) | 40 (mA) |
| Discharge time | 0.46 (ms) | 0.46 (ms) |

TABLE 2

The size of resulting alloy stud bumps

| | Silver alloy stud bump | | Gold stud bump | |
| --- | --- | --- | --- | --- |
| | Diameter | Thickness | Diameter | Thickness |
| Sample number | 30 | 30 | 30 | 30 |
| Maximum | 40.2 μm | 16.3 μm | 40.7 μm | 16.4 μm |
| Minimum | 36.4 μm | 15.6 μm | 36.5 μm | 15.8 μm |
| Average | 38.2 μm | 15.8 μm | 39.1 μm | 16.0 μm |

TABLE 3

The adhesion force of resulting stud bumps

|  | Silver alloy stud bump | Gold stud bump |
|---|---|---|
| Sample number | 30 | 30 |
| Maximum | 25.6 g | 22.7 g |
| Minimum | 23.5 g | 20.2 g |
| Average | 24.8 g | 21.1 g |

Example 2

Reliability Test

The silver alloy stud bump in Example 1, gold stud bump in Comparative Example 1, and copper stud bump in Comparative Example 2 manufactured on silicon chips were respectively bonded to a chip and then underfilled and flip-chip assembled to a bismaleimide triazine resin (BT resin) substrate of a ball grid array package (BGA) by a soldering process (solder composition: 96.5 wt % Pb-3 wt % Ag-0.5 wt % Cu). Then, the free air ball was disposed on the back side of the BT substrate to finish the assembly of a flip chip/BGA high density packaging product. After that, a temperature cycling test (TCT), a pressure cooking test (PCT), and a high temperature storage (HTS) test were performed on each of the resulting stud bump packaging products to test their reliability.

According to the experiments, the intermetallic compound formed between the interface between the gold stud bump in Comparative Example 1 and the aluminum pad on the chip had a thickness of 2.1 µm. The intermetallic compound was so thick that the connection points of the product became brittle and broken, resulting in a failure of the product. On the other hand, the intermetallic compound formed between the interface of the copper stud bump in Comparative Example 2 and the aluminum pad had a thickness of only 0.1 µm. The amount of the intermetallic compound was too little to know whether the connection was successful or not. However, the intermetallic compound formed at the interface between the silver alloy stud bump in Example 1 and the aluminum pad had a thickness of 0.8 µm. The intermetallic compound was thick enough to know whether the connection was completed, but it was not too thick to make it break easily.

In addition, 500 cycles of the temperature cycling test were performed on the gold stud bump in Comparative Example 1, and the thickness of the intermetallic compound of the gold stud bump greatly increased to 3.5 µm. 3000 cycles of the temperature cycling test were performed on the copper stud bump in Comparative Example 2, and the thickness of the intermetallic compound of the copper stud bump was only 0.3 µm. 3000 cycles of the temperature cycling test were performed to the silver alloy stud bump in Example 1, and the thickness of the intermetallic compound of the silver alloy stud bump increased to 1.2 µm.

Furthermore, after 168 hours of the pressure cooking test, the thickness of the intermetallic compound of the gold stud bump in Comparative Example 1 increased to 3.2 µm, the thickness of the intermetallic compound of the copper stud bump in Comparative Example 2 was only 0.4 µm, and the thickness of the intermetallic compound of the silver alloy stud bump in Example 1 increased to 1.4 µm.

Furthermore, after 500 hours of the high-temperature storage test, the thickness of the intermetallic compound of the gold stud bump in Comparative Example 1 increased to 4.5 µm, such that the aluminum pad on the chip was almost exhausted completely, the thickness of the intermetallic compound of the copper stud bump in Comparative Example 2 was only 1.1 µm, and the thickness of the intermetallic compound of the silver alloy stud bump in Example 1 increased to 1.7 µm.

Accordingly, the intermetallic compound of the gold stud bump in Comparative Example 1 grew so fast that the connection points became brittle. On the contrary, there was not enough of an intermetallic compound grown to know whether the connection was completed or not for the copper stud bump in Comparative Example 2. However, the intermetallic compound of the silver alloy stud bump in Example 1 had a thickness between the thickness of the intermetallic compound of the gold stud bump and that of the copper stud bump. In other words, the interface of the silver alloy stud bump did not become brittle and the connection was completed. Therefore, the silver alloy stud bump in Example 1 had a better reliability than the stud bumps in Comparative Examples 1 and 2.

Example 3

Wafer Level Package 12,000 of the silver alloy stud bumps in Example 1, gold stud bumps in Comparative Example 1, and copper stud bumps in Comparative Example 2 were formed on a silicon wafer (6 inches), respectively, to test for a wafer level package.

After all the stud bumps were formed on the wafer, the thickness of the intermetallic compound formed thereon was analyzed. According to the experiments, the intermetallic compound formed in first gold stud bump (Comparative Example 1) had a thickness of 2.1 µm, the intermetallic compound formed in the first copper stud bump (Comparative Example 2) had a thickness of 0.2 µm, and the intermetallic compound formed in the first silver alloy stud bump (Example 1) had a thickness of 0.7 µm.

Further, the wafers with the stud bumps were assembled with other wafers by hot pressing, and then the resulting products were sent to perform 500 cycles of the described temperature cycling test thereon. The result showed the average thicknesses of the intermetallic compound layers in first ten gold stud bumps (i.e. the first ten gold stud bumps formed at the initial stage of the process) and first ten copper stud bumps (i.e. the first ten copper stud bumps formed at the initial stage of the process) were respectively 4.2 µm and 0.5 µm, while the average thicknesses of the intermetallic compound layers in first ten silver alloy stud bumps (i.e. the first ten silver alloy stud bumps formed at the initial stage of the process) was 1.6 µm. The gold stud bumps formed at the beginning of the process became brittle and broke after all the stud bumps were formed. The copper stud bumps were poorly connected and were seriously oxidized, and the chip almost broke. However, the silver alloy stud bumps did not have the problems described above.

Furthermore, the yields of the gold stud bumps in Comparative Example 1 and the silver alloy stud bump in Example 1 were almost 100%. However, the yield of the copper stud bumps in Comparative Example 2 was about 64%.

In addition, an average adhesion force of the first ten gold stud bumps was about 10% lower than an average adhesion force of the last ten gold stud bumps (i.e. the last ten gold stud bumps formed at the final stage of the process). An average adhesion force of the first ten copper stud bumps was about 22% lower than an average adhesion force of the last ten copper stud bumps (i.e. the last ten copper stud bumps formed at the final stage of the process). An average adhesion force of the first ten silver stud bumps was almost the same with an average adhesion force of the last ten silver alloy stud bumps (i.e. the last ten silver alloy stud bumps formed at the final stage of the process).

Example 4

2.5D-IC Package Application

The silver alloy stud bumps in Example 1 and copper pillars with a diameter of 40 μm formed by the same method as the copper stud bumps in Comparative Example 2 were formed on an aluminum pad on an integral circuit chip respectively. A hot pressing head was used to bond the silver alloy stud bumps and the copper pillars respective to copper electrodes on a ceramic substrate comprising a ceramic interposer with completion of formation of through vias therein. The result showed that a lot of voids were present at the bonding interfaces of some of the copper pillars. The voids mainly resulted from the coplanarity problem of the copper pillars. In contrast, the result showed that all the silver alloy stud bumps presented perfect interfaces without known defects. The resulting products of the silver alloy stud bump were tested by a three-point bending dynamic fatigue test under a condition of displacement of 0.1 mm, and the result showed the average lifetime of the products was as high as 14,550 test cycles.

Example 5

3D-IC Package Application

The silver alloy stud bumps in Example 1 and copper pillars with a diameter of 40 μm formed by the same method as the copper stud bumps in Comparative Example 2 were formed on an aluminum pad on an integral circuit chip respectively. A hot pressing head was used to bond the silver alloy stud bumps and the copper pillars respective to copper electrodes on a crystalline silicon substrate comprising a silicon interposer with completion of formation of through silicon vias (TSVs) therein. The result showed that a lot of voids were present at the bonding interfaces of some of the copper pillars. The voids mainly resulted from the coplanarity problem of the copper pillars. In contrast, the result showed that all the silver alloy stud bumps presented perfect interfaces without known defects. The resulting products of the silver alloy stud bump were tested by a three-point bending dynamic fatigue test under a condition of displacement of 0.1 mm, and the result showed the average lifetime of the products was as high as 16,280 test cycles.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A stud bump structure, comprising:
a first chip; and
a silver alloy stud bump disposed overlying the first chip, wherein a composition of the silver alloy stud bump is selected from one of a group consisting of
0.01 to 10 weight percent of palladium, 10 to 800 ppm of a trace metal and a balance of silver, wherein the trace metal comprises at least one of 10 to 600 ppm of beryllium, 10 to 100 ppm of cerium and 10 to 100 ppm of lanthanum;
0.01 to 10 weight percent of palladium, 0.01 to 10 weight percent of platinum, 10 to 800 ppm of a trace metal and a balance of silver, wherein the trace metal comprises at least one of 10 to 600 ppm of beryllium, 10 to 100 ppm of cerium and 10 to 100 ppm of lanthanum; and
0.01 to 10 weight percent of palladium, 0.01 to 10 weight percent of platinum, 0.01 to 10 weight percent of gold, 10 to 800 ppm of a trace metal and a balance of silver, wherein the trace metal comprises at least one of 10 to 600 ppm of beryllium, 10 to 100 ppm of cerium and 10 to 100 ppm of lanthanum.

2. The stud bump structure as claimed in claim 1, wherein the first chip comprises a divided single semiconductor chip or an undivided chip in a semiconductor wafer.

3. The stud bump structure as claimed in claim 1, wherein the first chip further comprises a bonding pad, and the silver alloy stud bump is disposed overlying the bonding pad.

4. A package structure, comprising:
a first chip comprising an on-chip bonding pad;
an on-chip silver alloy stud bump disposed overlying the on-chip bonding pad of the first chip; and
a substrate comprising an on-substrate bonding pad electrically connected to the on-chip silver alloy stud bump by flip-chip bonding to the first chip, wherein
a composition of the on-chip silver alloy stud bump is selected from one of a group consisting of
0.01 to 10 weight percent of palladium, 10 to 800 ppm of a trace metal and a balance of silver, wherein the trace metal comprises at least one of 10 to 600 ppm of beryllium, 10 to 100 ppm of cerium and 10 to 100 ppm of lanthanum;
0.01 to 10 weight percent of palladium, 0.01 to 10 weight percent of platinum, 10 to 800 ppm of a trace metal and a balance of silver, wherein the trace metal comprises at least one of 10 to 600 ppm of beryllium, 10 to 100 ppm of cerium and 10 to 100 ppm of lanthanum; and
0.01 to 10 weight percent of palladium, 0.01 to 10 weight percent of platinum, 0.01 to 10 weight percent of gold, 10 to 800 ppm of a trace metal and a balance of silver, wherein the trace metal comprises at least one of 10 to 600 ppm of beryllium, 10 to 100 ppm of cerium and 10 to 100 ppm of lanthanum.

5. The package structure as claimed in claim 4, wherein the first chip comprises a divided single semiconductor chip or an undivided chip in a semiconductor wafer.

6. The package structure as claimed in claim 4, wherein the substrate comprising a second chip which is a silicon interposer chip, a silicon interposer wafer, a ceramics interposer substrate or a printed circuit board.

7. The package structure as claimed in claim 4, wherein the on-chip silver alloy stud bump and the on-substrate bonding pad are electrically connected by an adhesive therebetween, a solder material therebetween or direct bonding performed by a step of direct hot pressing bonding.

8. The package structure as claimed in claim 7, wherein the adhesive is an isotropic electrically conductive adhesive or an anisotropic electrically conductive adhesive.

9. The package structure as claimed in claim 7, wherein the on-chip silver alloy stud bump and the on-substrate bonding pad are supported by an electrically non-conductive adhesive and therefore in direct intimate contact with each other.

10. The package structure as claimed in claim 7, wherein a bonding interface is formed between the on-chip silver alloy stud bump and the on-substrate bonding pad by direct heating and pressing to make the on-chip silver alloy stud bump plastically deformed and react to materials of the on-substrate bonding pad.

11. The package structure as claimed in claim 7, wherein a bonding interface of the directly bonded on-chip silver alloy stud bump and on-substrate bonding pad comprise a solder alloy or a tin containing intermetallics layer.

* * * * *